United States Patent [19]

Plesko

[11] Patent Number: 5,357,101
[45] Date of Patent: Oct. 18, 1994

[54] ELECTRO-OPTICAL TRANSCEIVER WITH NONIMAGING CONCENTRATOR

[75] Inventor: George A. Plesko, Media, Pa.

[73] Assignee: GAP Technologies, Incorporated, Media, Pa.

[21] Appl. No.: 945,157

[22] Filed: Sep. 15, 1992

[51] Int. Cl.$^5$ ............................................... H01J 3/14
[52] U.S. Cl. ...................... 250/216; 359/853
[58] Field of Search ............ 250/216, 234–236, 250/566, 568, 551; 359/152, 193, 853; 235/467, 472

[56] References Cited

U.S. PATENT DOCUMENTS

| | | |
|---|---|---|
| 4,042,821 | 8/1977 | Mierzwinski .................. 250/216 |
| 4,907,864 | 3/1990 | Hagerty et al. ................. 359/653 |
| 4,962,311 | 10/1990 | Poisel et al. ................... 250/216 |
| 5,023,440 | 6/1991 | Kuppenheimer, Jr. .......... 250/216 |
| 5,047,617 | 9/1991 | Shepard et al. ................ 235/472 |

*Primary Examiner*—David C. Nelms
*Attorney, Agent, or Firm*—Reed Smith Shaw & McClay

[57] ABSTRACT

A compact high efficiency electro-optical information collection system is ideally suited for application as an optical front-end receiver in miniature bar code reading systems, optical local area networks (LANs) used in computer communications and other such equipment. The invention includes a single component high efficiency photoelectric converter with nonimaging light collection element, integral filter, photo diode, and mounting means all combined in a miniature rugged package.

58 Claims, 6 Drawing Sheets

ELECTRO-OPTICAL TRANSCEIVER WITH NONIMAGING CONCENTRATOR

BACKGROUND OF THE INVENTION

The usefulness and novelty of the present invention is illustrated by considering typical requirements and challenges in the design of a bar code reading system.

In a beam scanning type barcode reader a small spot of light of a specific wavelength, usually from a laser, is rapidly scanned across the barcode target to be read. For purposes of definition the means of scanning light shall be called a scan element. As the spot of light traverses the alternating dark and light bands of the code it is absorbed and diffusely reflected.

The barcoded information is radiated as diffuse light reflected in all directions from the target in the form of high frequency light pulses. A portion of this diffuse light returns to the bar code reader, whereupon the bar code reader collects and processes it. Unwanted stray light of wavelengths of light different from that emitted by the laser are filtered out to improve signal to noise ratio. The collected light signal is directed onto a photoelectric converter, usually a photodiode, whereupon it is transformed into electronic signals, further amplified, and shaped into digital pulses suitable for computer processing.

A major concern in the design of a beam scanning type bar code reader is that the amount of information bearing light reaching the bar code reader is very small. Usually the laser output power is limited to only one milliwatt for safety reasons and the barcode target may be located several feet from the barcode reader. Also the paper upon which the barcode is printed often is selected for eye appeal rather than its light reflecting characteristic and thus may be far from an ideal reflector in the areas which are not printed with dark bars. In consideration of these factors it is clear that the light returned to the photoelectric converter is indeed very weak.

In order to reliably process such weak information signals it is incumbent upon the light collection means of the barcode reader to collect as much of the returned light as possible and to concentrate it upon the photoelectric converter with the highest possible signal to noise ratio.

Another critical consideration in the processing of the light signal returned from the barcode is its pulse rate or frequency. This frequency may be quite high and require very high speed response of the photodiode as well as wide bandwidth amplification.

For example it is quite common in industrial barcode scanners to scan the spot back and forth through a thirty degree angle at a rate of two hundred scans per second. It is readily calculated at only one foot away from the scan element the average spot speed will be over one hundred feet per second. In actual practice however the spot may not have a constant speed and will reach peak speeds of several times the average speed. As this spot moves across bars and spaces as small as five thousandths of an inch it may be shown that the frequency of the light pulses correspond to modulation frequencies of several hundred kilohertz. Some industrial scanners run at a thousand scans per second or more and hence may produce return light pulses which reach several megahertz. Thus the photoelectric converter must have a very high speed detection capability.

From the foregoing discussion it may be concluded that the farther away the target is from the scan element the weaker will be the returned light signal and the higher its frequency will be. These considerations complicate the signal handling requirements imposed upon a photo detection system. In fact the requirements may be in conflict as is shown below.

It is well known that a photodiode used as a photoelectric converter must have low junction capacitance in order to meet the needs of high speed signal detection. However junction capacitance increases in proportion to the area of the junction. Yet large junctions increase light gathering capacity and are desirable where weak signal detection is necessary. Also, in order to obtain a high signal to noise ratio, photodiodes must also possess low dark current leakage and high shunt resistance. These properties all get worse the larger the junction area of the photodiode is. When both high speed and great sensitivity are needed as in the case of barcode reading or LAN reception the two requirements for speed and sensitivity are in conflict. In order to lower junction capacitance, reverse bias voltage may be applied to the photodiode. This however has the drawback of increasing noise from the photodiode which tends to diminish the signal to noise ratio. It is not always possible to sacrifice signal to noise ratio where signals are already weak. More expensive PIN photodiodes have lower junction capacitance than the PN junction photodiodes but are much more expensive per unit area. Thus a designer must choose a high priced premium photodiode to begin with and make compromises from there.

In low speed scanners with scan rates on the order of 36 scans per second it has been feasible to use two large area photodiodes to collect light. U.S. Pat. No. 4,387,297 describes such a low speed scanner which uses a pair of photo diodes to collect light directly. This approach is expensive and consumes considerable space due to mounting requirements for the photodiodes and is inadequate for higher speed scanners running at hundreds of scans per second.

In order to improve the signal to noise ratio and keep the junction size down, lenses have been used to collect and concentrate light upon a photodiode surface. A positive lens or combinations of lenses are sometimes used to focus light on a photodiode but these are expensive and suffer from other drawbacks as will be seen.

U.S. Pat. No. 4,797,551 describes a multiple lens and mirror system for light concentration. This approach improves signal to noise ratio but is characterized by slow speed since the photodiode must be large enough to roughly accommodate the entire image of the target area scanned.

Another approach to light collecting is to use a large mirror which simultaneously scans and tracks the outgoing beam. This mirror with its large surface area serves as a light collector for the reflected light which is in turn reflected off a concave mirror and focused upon a photodiode. This approach with its many parts and optical layout is not compact. It also requires that the image of the entire target as viewed by the tracking mirror be imaged upon a photodiode which still demands a considerable area diode with its attendant junction problems.

U.S. Pat. No. 4,816,660 describes the use of a large concave second surface mirror with a small first surface mirror attached to it for scanning the outgoing light beam. The concave second surface mirror moves along with the first surface scanning mirror so as to track the spot. The mirrors are attached to the shaft of a stepper motor which serves as a scan element in order to move them.

Returned light intercepted by the concave collector mirror images the light onto a photodiode. This system saves some parts but since the concave collection mirror must move, its mass places an inertial load on the scan element tending to make this system inherently slow and considerable power is required to dither the mirror. Another shortcoming of this approach is the lack of ruggedness of the mirror motor combination. In portable applications this system is highly vulnerable to breakage upon dropping and to shock.

U.S. Pat. No. 4,794,237 uses a spinning holographic disc to scan and collect light and to image it onto a suitable photoelectric converter, as well as to filter out unwanted wavelengths. But holographic systems are bulky, expense and fragile.

Presently very high density two dimensional bar codes are being introduced into commercial use. These are read by high speed raster scan techniques. To read these codes the beam is swept rapidly back and forth across them and at the same time slowly down them in zig-zag or raster fashion. High speed photodetection and signal processing is necessary to read two dimensional bar code since scan rates are about an order of magnitude higher than for straight line scanning. For these scan systems it is desirable to use very small mirrors with low inertia in order to scan at high speeds but small mirrors collect only small amounts of light.

OTHER APPLICATIONS

In the computer industry where Local Area Networks (LANs) are used to interconnect computers, traditionally fiber optics, coaxial cables, or twisted pairs of wire have been used to "hard wire" computers together. Recently, it has been desirable to use light beam transceivers to transmit and to receive modulated light signals directed at a central spot on an office ceiling for computer communication. This technique does away with the need for hard wiring but again requires very high speed photo detection and high sensitivity.

All the known types of collection optics at this time for use in barcode readers, LANS and the like use either image forming light concentrators such as lenses or mirrors or simply large area photodiodes. None are known to employ the use of nonimaging light collectors.

Nonimaging light collectors however have been described for use in collecting Cerenkov radiation in the field of nuclear research. (Hinterberger and Winston, 1966, Efficient Light Coupler for Threshold Cerenkov Counters. Rev. Sci. Instrum. 37, 1094–1095)

Nonimaging collectors have also been described for use in solar energy collection as early as 1966. Dozens of references pertaining to solar energy collection, and experimental laboratory methods as well as the theory of nonimaging optical collectors are referenced in the book; "High Collection Nonimaging Optics" by W. T. Welford and R. Winston, 1989, Academic Press Inc.

The literature points out that nonimaging light collectors are inherently superior to imaging type collectors in their ability to concentrate light and to eliminate light outside of desired maximum collection angle.

NEW APPLICATIONS

For bar code readers, Local Area Networks, optical signal repeaters and the like, an ideal optical signal detection system would be a single component, able to accommodate very high speed signals and would have high light detection sensitivity. Such a component would also be small in size, rugged, easily mounted, capable of rejecting unwanted light and would have no moving parts. It would transform light signals into clean low noise electrical signals.

It has been discovered that nonimaging light collectors are admirably suited as light concentrators in bar code readers and other products described herein. Accordingly, the present invention describes the application and construction of electro-optical nonimaging light collection components for use in modern optical information collection systems.

SUMMARY OF THE INVENTION

Accordingly it is the general goal of this invention to overcome the drawbacks of the prior art light conversion devices used in LANs, barcode readers and other optically based information collection systems.

It is also an object of this invention to provide a miniature, light weight, rugged, single component optical information collection system.

It is a further object of the present invention to provide a single component optical information collection system with no moving parts capable of detecting weak, high frequency light signals.

It is another object of this invention to provide a sensitive, high frequency optical information collection system which uses a high efficiency nonimaging optical element cooperative with a small junction photodiode.

It is also an object of this invention to eliminate interference from light signals of undesirable wavelengths as well as to virtually eliminate light coming from undesired directions.

It is yet another object of this invention to provide a means of optical signal enhancement by incorporating an excitable medium and means of optically pumping said medium in order to amplify incoming optical signals by stimulated emission of radiation prior to converting said optical signals into electronic signals.

It is an additional objective of the present invention to provide a compact light receiver for use in a barcode reader.

It is also an object of this invention to provide a means of light detection for LAN signal communications.

These and other objects and benefits of the invention will become apparent upon review of the drawings, the description thereof, and the claims.

BRIEF DESCRIPTION OF THE DRAWINGS

FIG. 10 illustrates a compact hand held optical barcode reading system utilizing a high efficiency light receiver and a motion activated inertial switch for turning it on.

DETAILED DESCRIPTION OF THE INVENTION

Figure 2:
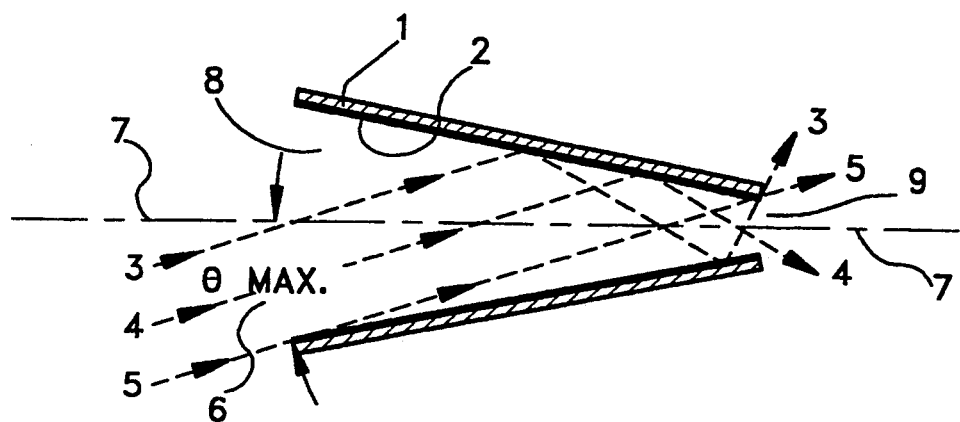
FIG. 2 is a drawing of a cone concentrator showing paths of incoming light rays and concentration of them.

A cone concentrator as illustrated in FIG. 2 is an example of a nonimaging light collector. This device has rotational symmetry about axis 7 and as such is called a 3-D nonimaging collector. The inner wall 2 of cone 1 is coated with a highly reflective material so as to form a mirror like interior surface. When light rays 3,4,5 enter cone aperture 8 at an angle equal to or less than characteristic angle Θ max 6 they are internally reflected by the interior mirror surface 2 and are concentrated at exit aperture 9 without forming an image.

By design, the angle Θ max 6 is the maximum angle at which rays may be generally concentrated so as to emerge from exit aperture 9.

Most rays entering the cone concentrator 1 entry aperture 8 at an angles less than Θ max 6 will be internally reflected and concentrated at exit aperture 9 whereas rays entering aperture 8 at angles slightly larger than Θ max will be turned back and will not emerge from exit aperture 9.

Figure 3:
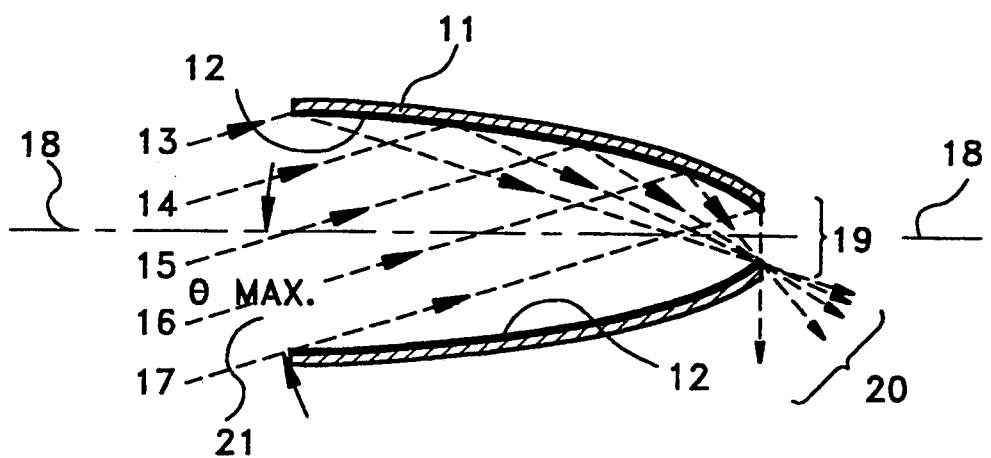
FIG. 3 is a drawing of a high efficiency "CPC" type light concentrator illustrating light ray paths for incoming light and the concentration of it.

A nonimaging light concentrator of far greater efficiency is depicted in FIG. 3. The device depicted in FIG. 3 is called a Compound Parabolic Concentrator or CPC 11 and has an axis of rotational symmetry 18 hence it is also a 3-D concentrator. (2-D concentrators are shaped like troughs.) CPC 11 also has an internally reflective inner surface 12. Surface 12 is usually coated with a reflective metal such as aluminum. For a CPC 11 light entering at an angle less than Θ max 21 is concentrated at exit aperture 19 but light entering it at an angle greater than Θ max 21 is turned back and will not emerge from exit aperture 19. A CPC is an almost ideal light concentrator, superior to imaging type light concentrators, and is better than most known nonimaging concentrators. Equations for the shape and design of CPC collector/concentrators are described in the Winston references cited previously.

The concentration ratio for light collectors may be expressed as A/A' where A is the area of the large entrance aperature of the concentrator and A' is the area of the small exit aperature for the concentrated light.

This ratio A/A' is dependent upon the design of the concentrator and the angle at which light is introduced to it.

Figure 4:
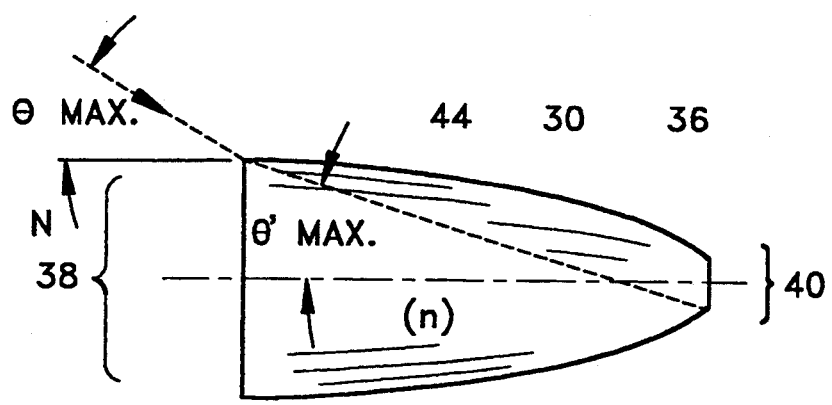
FIG. 4 is a drawing of a dielectric filled CPC light collector.
Figure 5:
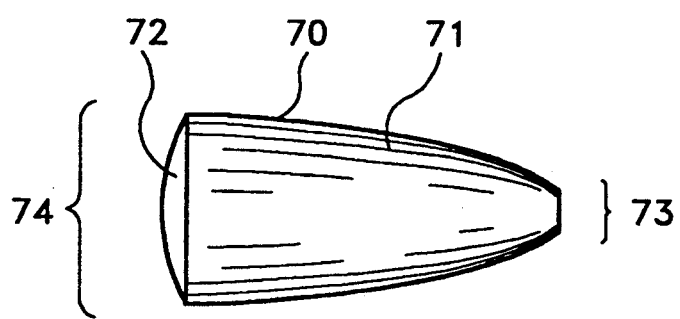
FIG. 5 is a drawing of a dielectric filled CPC light collector with integral positive lens for decreasing the overall length of the CPC.

For an ideal 3-D nonimaging concentrator such as a CPC 11 in FIG. 4 the literature reveals that the maximum theoretical concentration ratio for light introduced at angle less than or equal to Θ max 21 into a nonimaging light concentrator may be expressed by formula:

$$A/A' = 1/(\sin \Theta\ max) \qquad (1.0)$$

Evaluation of formula (1.0) shows that an ideal concentrator designed for a maximum collection angle Θ max of ten (10) degrees can have a concentration ratio as high as 33.16. A properly constructed 3-D CPC is nearly a theoretically ideal light concentrator and real devices can achieve concentration ratios very close to the theoretical maximum.

If a 3-D CPC as shown in FIG. 4 is filled with a transparent dielectric material 46 of refractive index n, which is higher than the refractive index N, of its surrounding 50, the concentration ratio can be made even higher.

Continuing with FIG. 4, an incoming light ray 42 is depicted entering surface 45 at maximum exterior angle Θ max 32 whereupon the ray 42 is refracted according to Snells' law and diverted so that it travels along path 44 inside the dielectric at a new angle Θ'max 34 which is smaller than Θ max 32. If index N of surrounding material 50 is that of air and is taken as 1, then the maximum concentration ratio for a theoretically ideal concentrator filled with material of refractive index n is:

$$A/A' = n^2/(\sin \Theta\ max)^2 \qquad (2.0)$$

For example if a 3-D CPC is designed for maximum collection angle Θ max=10 degrees as in Θ max 32 of FIG. 4 and polycarbonate thermoplastic is used as an internal dielectric filler which has an index of refraction of 1.58, then this device can achieve a light concentration ratio of 82.78.

In the ideal case one would want to design a concentrator so that all light that comes into the entrance aperture at an angle less than or equal to the design angle Θ max (sometimes referred to as the transmission angle), will emerge from the exit aperture.

Figure 6:
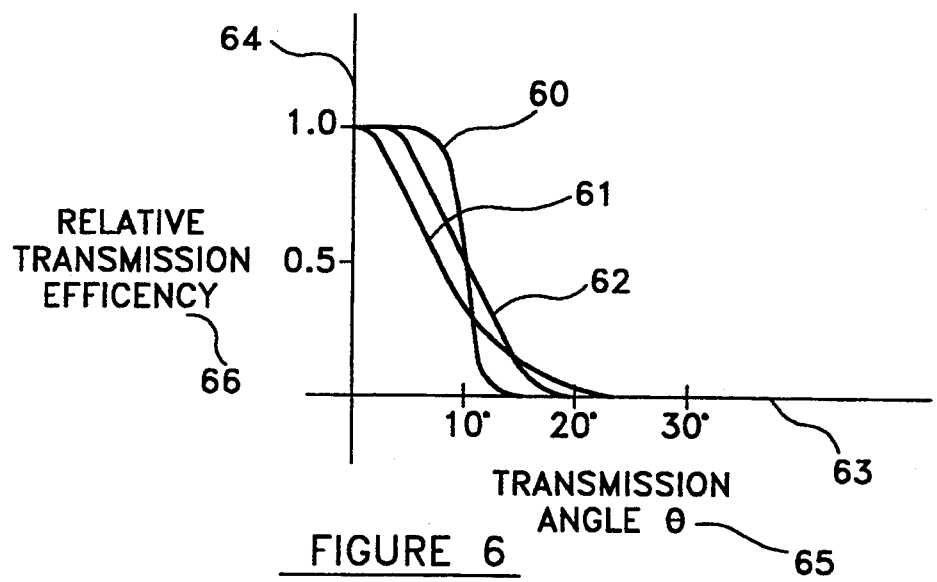
FIG. 6 is a graph showing the superior effectiveness of non imaging light collectors in rejecting light beyond the desired field of view as compared to a an imaging type light concentrator.

FIG. 6 is a graph of the relative transmission efficiency 66 vs transmission angle 65 of three types of light concentrators designed for incoming light at Θmax=10 degrees or less. The transmission curves represent a CPC 60, a Cone Concentrator 62 and an imaging Paraboloidal Mirror 61.

The curve for the Paraboloidal mirror is similar to other imaging optical components and all these are worse than a properly designed cone. The CPC is the best device and by far the closest to ideal.

The curves 60,61,62 of FIG. 6 also show that a CPC is capable of virtually rejecting all light coming from angles larger than that for which it is designed to concentrate. This is a very valuable feature in eliminating stray light which would decrease the signal to noise ratio in a bar code signal or signals from other optical information collection devices.

Figure 8:
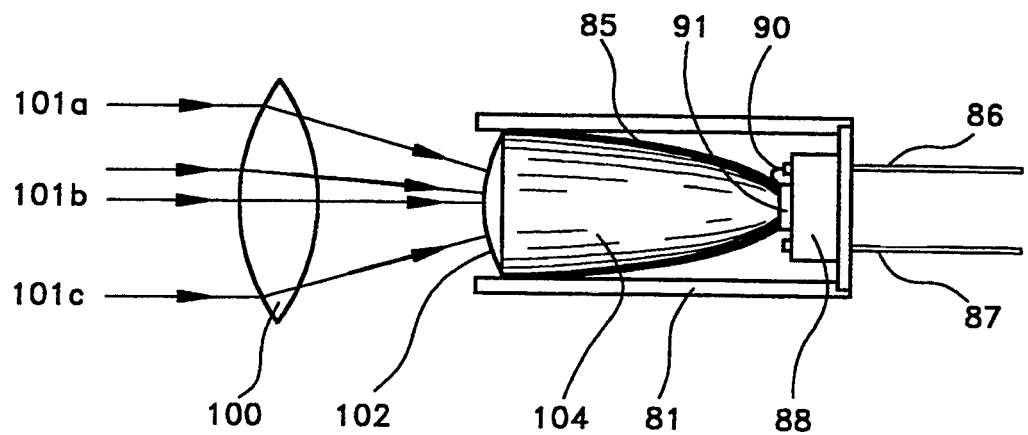
FIG. 8 is an enhanced embodiment of the invention including light filtering medium and external condensing lens.

FIG. 8 illustrates how the light concentrating ability of a dielectric filled CPC 104 can be further enhanced by fabricating it with an integral positive lens 102 at its entrance and by placing an auxiliary lens 100 in front of it.

DESCRIPTION OF BEST MODE

Figure 7:
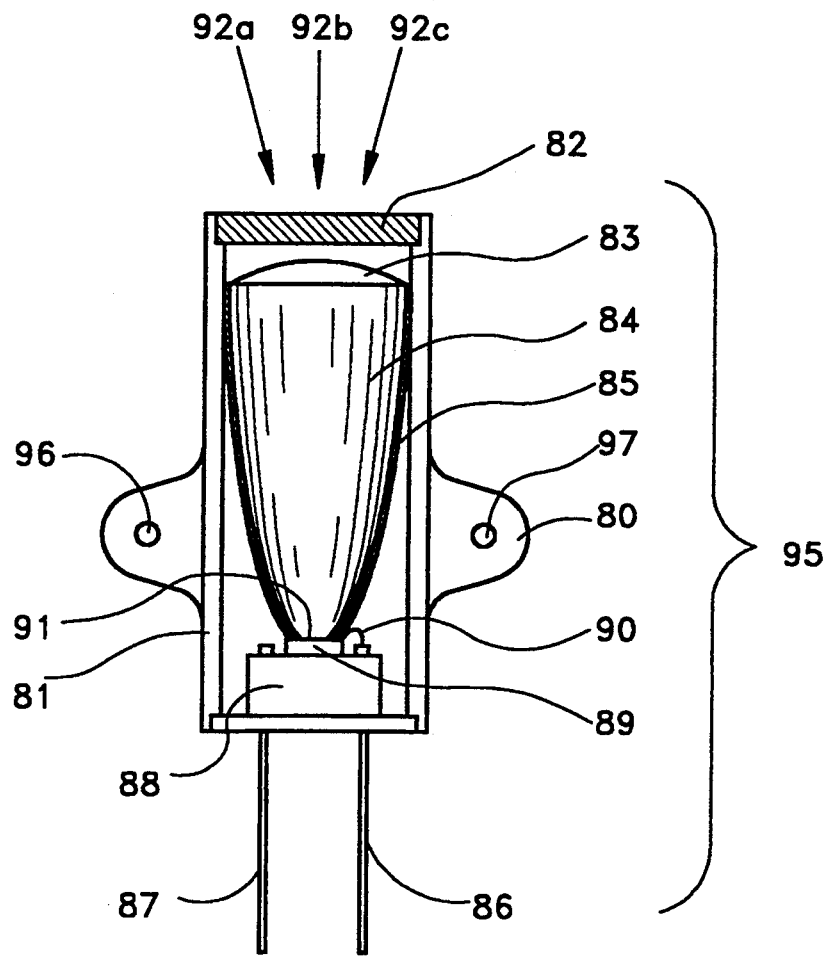
FIG. 7 is a drawing of a preferred embodiment of the invention showing a single element high efficiency electro-optical component incorporating a dielectric filled CPC, photoelectric converter and housing.

Now turning to FIG. 7 an electro-optical component 95 is shown which is ideally suited for receiving light reflected from barcode, LAN transmitters or similiar sources of high frequency low intensity light.

In the electro-optical component 95, of FIG. 7, light signals 92 first enter an optical filter 82 whereupon unwanted wavelengths of light are strongly diminished. Filter 82 may comprise a polarizing filter for diminishing light of unwanted polarity.

Light at the wave length of interest which contains information passes through filter 82 and is refracted by lens 83 which is adjacent to nonimaging light concentrator 84.

It is preferred that light collector 84 is a compound parabolic concentrator (CPC) made from or filled with a dielectric material of high refractive index. A highly reflective coating 85 is generally applied to the concentrator 84. However, if the acceptance angle $\Theta$ max as discussed in the case of FIG. 4 is small enough and the index of refraction of the dielectric of concentrator 84 is high enough the reflective coating 85 may be omitted because the phenomenon of total internal reflection would serve to internally reflect the light within the concentrator 84 and thereby bring about concentration.

Incoming rays 92a, 92b and 92c which satisfy the angular collection requirements of nonimaging collector 84 by design will be concentrated and will interact with the surface 91 of a photoelectric converter 89 to produce electrical signals. Only a small area photoelectric converter is required by virtue of the excellent light concentrating ability of the nonimaging collector 84. A small junction photodiode is preferred for the photoelectric converter 89.

Mounting base 88 holds the photoelectric converter 89 and provides a means of securing the photoelectric converter 89 to overall housing 81 of electro-optical component 95 for photoelectric converter 89. Leads 86 and 87 serve as the electrical output connections.

An overall housing 81 serves to hold the entire assembly together and mounting holes 96 and 97 provide a means of securely mounting the complete electro-optical component 95.

The device depicted in FIG. 7 is considered the best mode for the electro-optical component 95 just described. This device has the benefit of high light collection and concentration thereby requiring only a small area photoelectric converter such as a small junction photodiode. It has no moving parts, low mass and thus can be easily designed for immunity to shock and vibration. As such it is ideally suited for application in rugged environments as depicted in FIG. 10.

Figure 10:
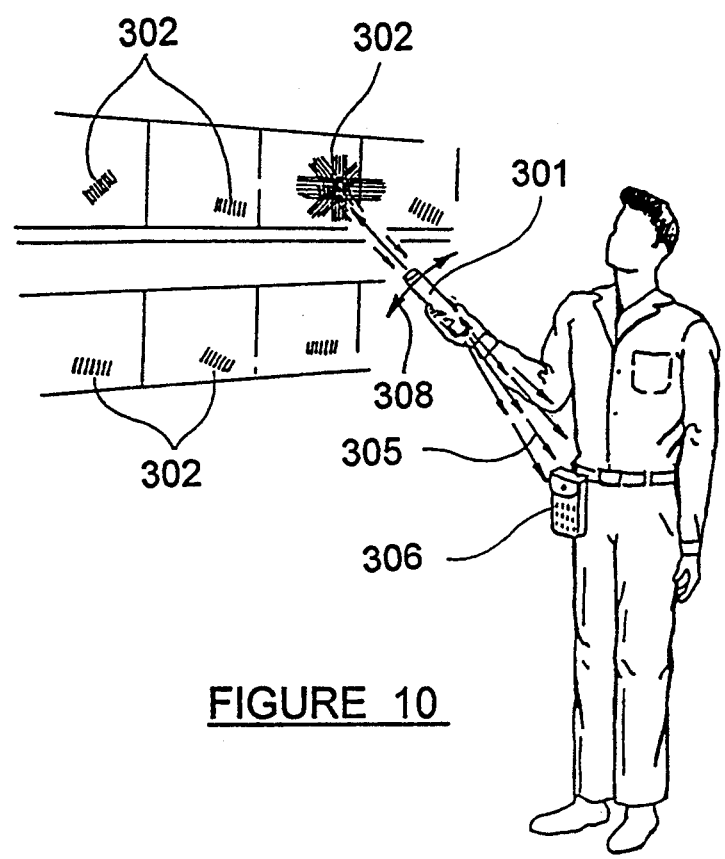

FIG. 10 illustrates a complete hand holdable barcode reader 301 which includes an inertial switch which is activated by a wave of the hand, indicated by arrow 308.

The electro-optic component 95 of FIG. 7 may also be designed to have light rejection properties for light coming from unwanted directions. In this regard the extraneous light rejection capabilities of electro-optic component 95 is superior to that of imaging type light collectors such as concave mirrors, lenses and the like.

A less expensive component but still a very practical and useful one may be made with fewer features than the best mode device depicted in FIG. 7.

One such component would consist of a nonimaging light collector/concentrator 84, photoelectric converter 91, base 88, leads 86 and 87, and housing 81.

It has been discovered that the optical filter 82, although very helpful, may be unnecessary for some applications. In such applications electronic band pass filtering in subsequent amplification stages may be employed to reject signals not in the proper frequency range for desirable information signals. Also the photoelectric converter 89 may be itself designed to have a particular wavelength sensitivity and thereby act to reduce sensitivity to light signals of unwanted wavelengths.

For superior high light collecting efficiency, an auxiliary lens 100 as shown in FIG. 8 may be added. Also filter 82 shown in FIG. 7 may be omitted by filling the nonimaging light collector 84 with a colored dielectric material which itself acts as a filter by absorbing unwanted wavelengths and allowing only light of desired wavelengths to interact with the surface 91 of photoelectric converter 89.

Figure 9:
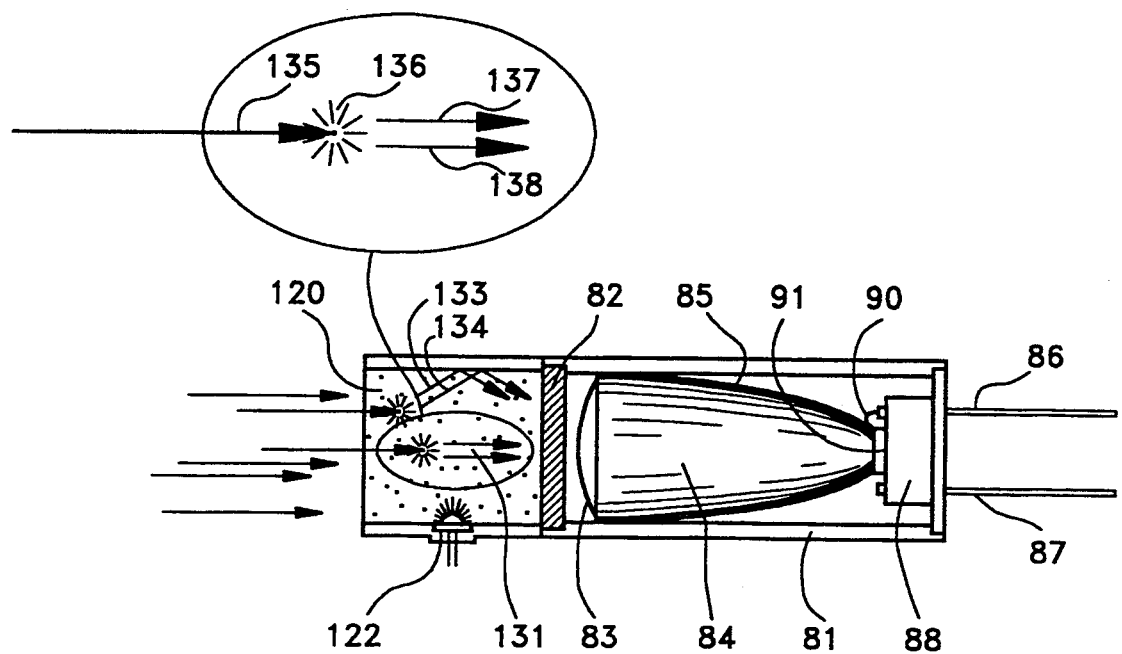
FIG. 9 is a further enhanced embodiment of the invention showing elements necessary for light amplification by stimulated emission of radiation within the device.

Yet another means may be employed to enhance the light collecting power of the electro-optical component of the present invention. This is illustrated in FIG. 9 where an optically excitable medium 120 is doped with particles 136 capable of being optically pumped to quantum energy levels above the ground state by light source 122.

Incoming information light ray 135 of proper wavelength stimulates pumped particle 136 of excitable medium 120. Two rays of light 137 and 138 then emerge from the particle 136 thereby amplifying incoming light ray 135 by means of the phenomenon of stimulated emission of radiation.

At the current time the principle of light amplification as outlined above is being applied to light amplification in fiber optics. The Sumitomo Company of Japan has successfully doped optical fibers with Erbium and optical gains of 10 or more have been achieved in fiber optics. (Electronic Focus. World, July 1992, p. 44)

Figure 1:
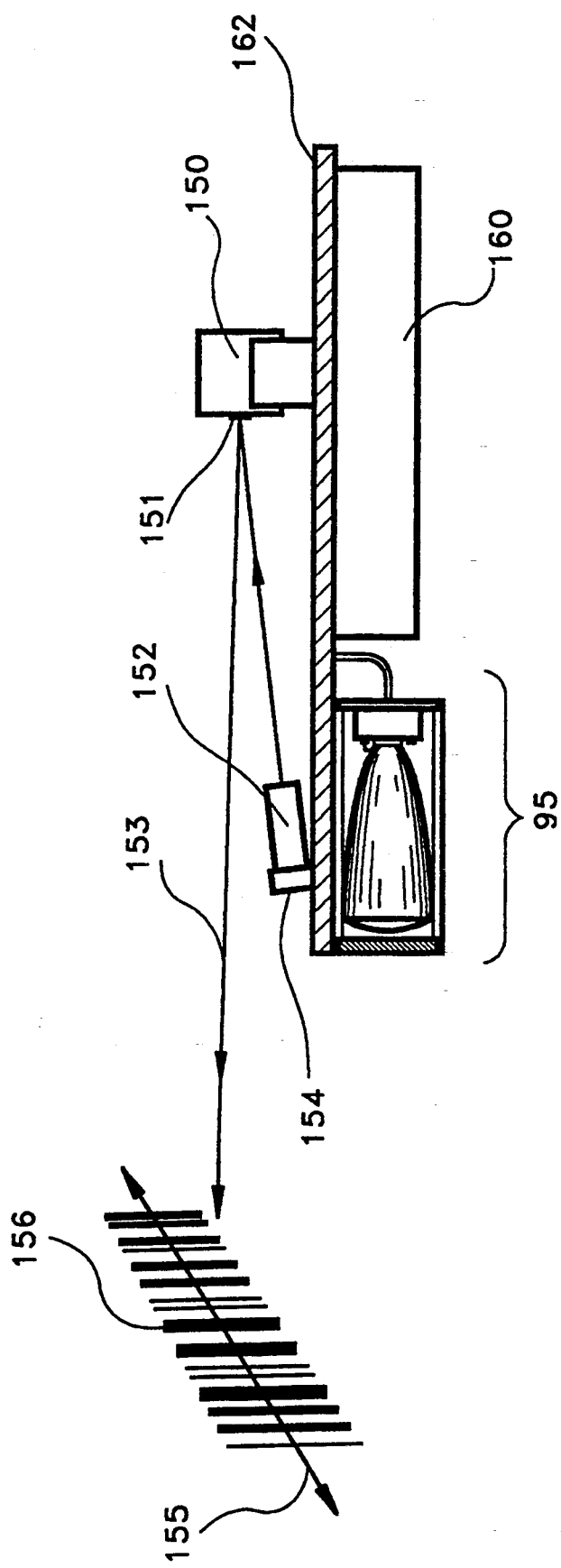
FIG. 1 illustrates an optical information reading system utilizing a single element electro-optic light receiver described in the present invention.

Turning now to FIG. 1 we see an illustration of a complete barcode scanning system utilizing the electro-optical component 95 of FIG. 7. In FIG. 1 a light source 152 forms a beam of light 153 which is reflected from mirror 151 mounted on scan element 150. The scan element 150 moves the mirror 151 causing it to sweep light beam 153 across a barcode target 156 in the vicinity 155. A nonimaging electro-optic component 95 as previously described in various forms efficiently detects reflected pulses of light from barcode 156 whereupon the information containing electronic signals are amplified and shaped by electronic means 160 and made ready for computer manipulation.

If the scan element 150 in FIG. 1 is eliminated, light source 152 may be modulated by modulator 154 to broadcast outgoing light pulses at a target area such as a ceiling in an office area. In an embodement such as this the essence of a Local Area Network transceiver is realized.

Many combinations of the foregoing techniques utilizing a nonimaging light collectors, as opposed to traditional imaging ones, may be constructed according to the specifications set forth above.

While particular embodiments of the present invention have been illustrated and described herein, it is not intended to limit the invention and changes and modifications may be made herein within the scope of the following claims.

What is claimed is:

1. An optical scanning system comprising:
   a light source;
   a scan element for scanning a light beam from said light source;
   an optical element coupled to said scan element for receiving light from said light source and directing light toward a target;
   a nonimaging light collector for receiving and concentrating reflected light from said target; and
   a photoelectric converter for receiving concentrated light from said nonimaging light collector and producing electrical signals which are responsive to said received light.

2. An optical scanning system according to claim 1, wherein said nonimaging light collector is formed essentially of a transparent dielectric material.

3. An optical scanning systems according to claim 2, wherein said nonimaging light collector has a reflective coating to facilitate internal light reflection therein.

4. An optical scanning system according to claim 3, wherein said nonimaging light collector is generally cone shaped.

5. An optical scanning system according to claim 3, wherein said nonimaging light collector is a compound parabolic concentrator.

6. An optical scanning system according to claim 2, wherein said nonimaging light collector concentrates light by total internal reflection within said transparent dielectric material.

7. An optical scanning system according to claim 6, wherein said nonimaging light collector is generally cone shaped.

8. An optical scanning system according to claim 6, wherein said nonimaging light collector is a compound parabolic concentrator.

9. An optical scanning system according to claim 1, wherein said nonimaging light collector has a reflective coating.

10. An optical scanning system according to claim 9, wherein said nonimaging light collector is generally cone shaped.

11. An optical scanning system according to claim 9, wherein said nonimaging light collector is a compound parabolic concentrator.

12. An optical scanning system according to claim 1, wherein said light source; scan element, optical element, nonimaging light collector and photoelectric converter are mounted on a single chassis.

13. An optical scanning system according to claim 12, wherein said chassis is a printed circuit board.

14. An optical scanning system according to claim 1, wherein said optical scanning system is a barcode reader.

15. An optical scanning system according to claim 14, wherein said barcode reader is self-powered so as to be portable.

16. An optical scanning system according to claim 14, wherein said barcode reader is dimensioned so as to be hand holdable.

17. An optical scanning system according to claim 15, wherein said barcode reader is activated by acceleration of an inertial switch.

18. An optical scanning system according to claim 15, wherein said barcode reader has a generally cylindrical shape.

19. An optical scanning system according to claim 18, wherein said barcode reader has a thumb switch on said generally cylindrical shape.

20. An optical scanning system according to claim 15, wherein said barcode reader has a handle grip.

21. An optical transceiver system comprising:
    a light source for transmitting light signals in the direction of a target;
    a modulation means for modulating said light source;
    a nonimaging light collector for receiving and concentrating light received from a target; and
    a photoelectric converter for receiving concentrated light from said nonimaging light collector and producing electrical signals which are responsive to received light.

22. An optical transceiver system according to claim 21, wherein said nonimaging light collector is formed essentially of a transparent dielectric material.

23. An optical transceiver system according to claim 22, wherein said nonimaging light collector has a reflective coating to facilitate internal reflection therein.

24. An optical transceiver system according to claim 23, wherein said nonimaging light collector is generally cone shaped.

25. An optical transceiver system according to claim 23, wherein said nonimaging light collector is a compound parabolic concentrator.

26. An optical transceiver system according to claim 22, wherein said nonimaging light collector concentrates light by total internal reflection within said transparent dielectric material.

27. An optical transceiver system according to claim 26, wherein said nonimaging light collector is generally cone shaped.

28. An optical transceiver system according to claim 26, wherein said nonimaging light collector is a compound parabolic concentrator.

29. An optical transceiver system according to claim 21, wherein said nonimaging light collector has a reflective coating.

30. An optical transceiver system according to claim 29, wherein said nonimaging light collector is generally cone shaped.

31. An optical transceiver system according to claim 29, wherein said nonimaging light collector is a compound parabolic concentrator.

32. An optical transceiver system according to claim 21, wherein said optical transceiver system is part of a local area network.

33. An optical transceiver system according to claim 21, wherein said optical transceiver system is part of an information repeater system.

34. An optical transceiver system according to claim 21, wherein said optical transceiver system is part of a transponder system.

35. An electro-optic component for collecting and concentrating optical information signals and converting said optical information signals into electrical signals comprising:
    a nonimaging light collector;
    a wavelength-selective optical signal filter;
    a photoelectric converter proximate said nonimaging light collector for converting said optical information signals into electrical signals and a housing for mounting and containing said nonimaging light collector and said photoelectric converter together as a single component.

36. An electro-optic component according to claim 35, wherein said nonimaging light collector is filled with a transparent dielectric material.

37. An electro-optic component according to claim 36, wherein said nonimaging light collector has a reflective coating to facilitate internal light reflection therein.

38. An electro-optic component according to claim 37, wherein said nonimaging light collector is generally cone shaped.

39. An electro-optic component according to claim 37, wherein said nonimaging light collector is a compound parabolic concentrator.

40. An electro-optic component according to claim 36, wherein said nonimaging light collector concentrates light by total internal reflection within said transparent dielectric material.

41. An electro-optic component according to claim 40, wherein said nonimaging light collector is generally cone shaped.

42. An electro-optic component according to claim 40, wherein said nonimaging light collector is a compound parabolic concentrator.

43. An electro-optic component according to claim 36, wherein said electro-optic component includes at least one of the following elements;
an optical filter for substantially preventing unwanted wavelengths of light from reaching said photoelectric converter;
a positive lens mounted in front of said nonimaging light collector;
a light filtering means included within the dielectric material of said nonimaging light collector for substantially preventing unwanted wavelengths of light from reaching said photoelectric converter;
a polarizing filter for substantially preventing light of unwanted polarity from reaching said photoelectric converter.

44. An electro-optic component according to claim 43, wherein said nonimaging light collector has a reflective coating.

45. An electro-optic component according to claim 43, wherein said nonimaging light collector is generally cone shaped.

46. An electro-optic component according to claim 43, wherein said nonimaging light collector is a compound parabolic concentrator.

47. An electro-optic component according to claim 43, wherein said nonimaging light collector concentrates light by means of total internal reflection.

48. An electro-optic component according to claim 47, wherein said nonimaging light collector is generally cone shaped.

49. An electro-optic component according to claim 46, wherein said nonimaging light collector is a compound parabolic concentrator.

50. An electro-optic component according to claim 43, wherein said positive lens is an integral part of said nonimaging light collector.

51. An electro-optic component according to claim 35, wherein said nonimaging light collector has a reflective coating.

52. An electro-optic component according to claim 51, wherein said nonimaging light collector is generally cone shaped.

53. An electro-optic component according to claim 51, wherein said nonimaging light collector is a compound parabolic concentrator.

54. An electro-optic component according to claim 51, wherein said electro-optic component includes at least one of the following elements;
an optical filter for substantially preventing unwanted wavelengths of light from reaching said Photelectric converter;
a positive lens mounted in front of said nonimaging light collector;
a polarizing filter for substantially preventing light of unwanted polarity from reaching said photoelectric converter.

55. An electro-optic component acccording to claim 54, wherein said nonimaging light collector is generally cone shaped.

56. An electro-optic component according to claim 54, wherein said nonimaging light collector is a compound parabolic concentrator.

57. An electro-optic component according to claim 36, wherein said transparent dielectric material is molded plastic.

58. An electro-optic component according to claim 43, wherein said electro-optic component includes;
an optically excitable medium; and a light source capable of optically pumping said medium to quantum energy levels above ground state whereby light signals received by said electro-optic component are amplified by means of stimulated emission of radiation prior to reaching said photoelectric converter.

* * * * *